(12) United States Patent
Hamilton et al.

(10) Patent No.: US 9,461,434 B2
(45) Date of Patent: Oct. 4, 2016

(54) SELF MODE-LOCKING SEMICONDUCTOR DISK LASER

(71) Applicant: SOLUS TECHNOLOGIES LIMITED, Glasgow (GB)

(72) Inventors: Craig James Hamilton, Glasgow (GB); Graeme Peter Alexander Malcolm, Glasgow (GB); Lukasz Kornaszewski, Glasgow (GB)

(73) Assignee: SOLUS TECHNOLOGIES LIMITED, Glasgow (GB)

( * ) Notice: Subject to any disclaimer, the term of this patent is extended or adjusted under 35 U.S.C. 154(b) by 0 days.

(21) Appl. No.: 14/389,247

(22) PCT Filed: Mar. 27, 2013

(86) PCT No.: PCT/GB2013/050800
§ 371 (c)(1),
(2) Date: Sep. 29, 2014

(87) PCT Pub. No.: WO2013/144620
PCT Pub. Date: Oct. 3, 2013

(65) Prior Publication Data
US 2015/0063390 A1    Mar. 5, 2015

(30) Foreign Application Priority Data

Mar. 29, 2012   (GB) .................................. 1205588.5

(51) Int. Cl.
*H01S 3/081*   (2006.01)
*H01S 5/10*    (2006.01)
(Continued)

(52) U.S. Cl.
CPC ............. *H01S 3/0813* (2013.01); *H01S 3/086* (2013.01); *H01S 3/0817* (2013.01);
(Continued)

(58) Field of Classification Search
CPC .. H01S 5/1075; H01S 5/0657; H01S 3/0817; H01S 3/0813

USPC ................. 372/93, 98, 99, 67, 36, 34, 45.01
See application file for complete search history.

(56) References Cited

U.S. PATENT DOCUMENTS 6,834,064 B1    12/2004  Paschotta et al.
2004/0190567 A1  9/2004  Lutgen et al.
(Continued)

FOREIGN PATENT DOCUMENTS

| EP | 1946414 | 7/2008 |
|----|---------|--------|
| GB | 2493583 | 2/2013 |
| WO | 2007/053336 | 5/2007 |

OTHER PUBLICATIONS

Härkonen et al., "Modelocked GaSb Disk Laser Producing 384 fs Pulses at 2 μm Wavelength" Electronic Letters, vol. 47, No. 7, Jan. 1, 2011, p. 454, XP055070624.
(Continued)

*Primary Examiner* — Kinam Park
(74) *Attorney, Agent, or Firm* — Nixon & Vanderhye P.C.

(57) ABSTRACT

The present invention describes a self mode locking laser and a method for self mode locking a laser. The laser (1) comprises a resonator terminated by first (3) and second (4) mirrors and folded by a third mirror (5). The third mirror comprises a single distributed Bragg reflector (17) upon which is mounted a multilayer semiconductor gain medium (18) and which includes at least one quantum well layer and an optical Kerr lensing layer (22). Self mode locking may be achieved by configuring the laser resonator such that the lensing effect of the Kerr lensing layer acts to reduce an astigmatism deliberately introduced to the cavity mode. The self mode locking of the laser may be further enhanced by selecting the length of the resonator such that a round trip time of a cavity mode is matched with an upper-state lifetime of one or more semiconductor carriers located within the gain medium.

29 Claims, 5 Drawing Sheets

(51) Int. Cl.
*H01S 3/086* (2006.01)
*H01S 3/11* (2006.01)
*H01S 5/065* (2006.01)
*H01S 5/14* (2006.01)
*H01S 5/34* (2006.01)
*H01S 3/08* (2006.01)
*H01S 5/024* (2006.01)
*H01S 5/04* (2006.01)
*H01S 5/183* (2006.01)
*H01S 3/094* (2006.01)

(52) U.S. Cl.
CPC .......... *H01S 3/1112* (2013.01); *H01S 5/0657* (2013.01); *H01S 5/1075* (2013.01); *H01S 5/141* (2013.01); *H01S 5/34* (2013.01); *H01S 3/0805* (2013.01); *H01S 3/094053* (2013.01); *H01S 5/02484* (2013.01); *H01S 5/041* (2013.01); *H01S 5/183* (2013.01)

(56) References Cited

U.S. PATENT DOCUMENTS

2007/0098031 A1\* 5/2007 Yang et al. ............... 372/45.012
2009/0290606 A1\* 11/2009 Chilla et al. ................... 372/18
2015/0063389 A1\* 3/2015 Hamilton et al. ......... 372/45.01

OTHER PUBLICATIONS

Krier: "Mid-Infrared Semiconductor Optoelectronics", 2006, Springer ISBN: 184628208X pp. 140-142.

Saarinen et al., "Power-Scalable 157 μm Mode-Locked Semiconductor Disk Laser Using Wafer Fusion", Optics Letters, vol. 34, No. 20, Oct. 7, 2009, p. 3139, XP055070616.

Keller et al., "Passively Modelocked Surface-Emitting Semiconductor Lasers", Physics Reports, vol. 429, No. 2, Jun. 1, 2006, pp. 67-120, XP024926285.

Kornaszewski et al., "SESAM-Free Mode-Locked Semiconductor Disk Laser", Laser & Photonics Reviews, vol. 6, No. 6, Aug. 27, 2012, pp. 23-23, XP055070226.

\* cited by examiner

SELF MODE-LOCKING SEMICONDUCTOR DISK LASER

This application is the U.S. national phase of International Application No. PCT/GB2013/050800 filed 27 Mar. 2013 which designated the U.S. and claims priority to GB 1205588.5 filed 29 Mar. 2012, the entire contents of each of which are hereby incorporated by reference.

The present invention relates to the field of semiconductor lasers and in particular to a semiconductor disc laser (SDL) configured to emit ultra short pulses of radiation.

It is noted that SDLs are also known in the art as Vertical External Cavity Emitting Lasers (VECSELs) or Optically Pumped Semiconductor Lasers (OPSLs). Therefore the term semiconductor disc laser (SDL) when used throughout the present description is used to refer to each of these systems.

The term "ultra short" pulses as used within the following description refers to pulses having a duration from about 100 picoseconds (ps) down to a few femtoseconds (fs).

Ultra short pulses of optical radiation generated by laser sources are employed in a range of scientific, instrumentation and nonlinear optics applications. One particular application for these ultra short pulses is in the field of nonlinear microscopy for example Two-Photon Excited Fluorescence (TPEF) microscopy or other similar multi-photon microscopy techniques. Historically, Ti:sapphire laser sources have been employed to perform these nonlinear microscopy techniques due to the inherent large tuneable ranges (700 nm to 1,000 nm) and peak powers available to such gain mediums. A Ti:sapphire laser system is generally optically pumped at a wavelength in the green region of the spectrum and therefore these systems are typically pumped with frequency-doubled solid state lasers having a neodymium-doped gain medium such as neodymium-doped YAG (Nd:YAG) or neodymium-doped yttrium orthovanadate (Nd:YVO$_4$) wherein radiation having a fundamental wavelength of about 1064 nm is converted into radiation having a wavelength of about 532 nm by frequency-doubling techniques. As a result, the above described solid state ultrafast lasers are relatively complex, bulky, have high maintenance requirements and most significantly are expensive to produce.

As an alternative to Ti:sapphire laser sources, it is known in the art to employ ultrafast semiconductor saturable absorber mirrors (SESAM) for mode locking diode pumped solid state-lasers. Compact designs have been realised by "folding" long cavities or by increasing the repetition rate of the lasers which naturally allows for a shorter cavity length. The main drawback of systems that employ SESAMs is that they are still relatively complex to produce and maintain.

More recently compact ultrafast chromium-doped laser systems such as Cr:LiCAF, Cr:LiSAF, and Cr:LiSGAF lasers have been developed and employed for nonlinear TPEF microscopy. Although average powers of up to 500 mW have been demonstrated, systems based on such materials are often limited in their ability to sufficiently scale their average power.

Other alternative sources based on fibre lasers and semiconductor laser diode with amplification schemes have also been successfully demonstrated as compact lasers for non-linear microscopy applications. Fibre lasers can be employed to generate very short pulses via passive mode locking techniques. They are however limited to operating at wavelengths around 1030 nm and 1550 nm and the second harmonics produced from these fundamental wavelengths. Within semiconductor lasers with amplification schemes e.g. gain-switched sources based on vertical cavity surfaces emitting lasers (VECSELs); gain switched InGaAsP Distributed Feedback-Bragg (DFB), laser diode; and external cavity mode-locked laser diode consisting of multiple quantum wells (AlGaAs), the simplicity or compactness of the system is compromised as they all require several stages to compress and or amplify the generated optical pulses.

One key aspect of optimising a compact laser system for nonlinear microscopy applications is the critical trade off between repetition rate of the laser and the multi-photon signal strength generated. The signal strength in TPEF microscopy scales as the product of the peak power times the average power (assuming image spot size, absorption, sample, detection path, etc. remain constant). An example of an ultra short pulse mode-locked SDL is described in US patent publication number US 2009/0290606. This document describes optically pumping the SDL gain structure with optical pulses, delivered at a pulse repetition frequency corresponding to a resonant frequency of the laser resonator. The resonator additionally includes a passive mode locking arrangement such as an optical element that exhibits a strong optical Kerr effect, a second harmonic generating nonlinear crystal which acts in conjunction with the output coupler, or an output coupler which comprises a semiconductor saturable absorber mirror (SESAM). Although the described combination of optically pumping the gain structure with an optical pump pulse source in conjunction with a passive mode locking scheme is capable of generating pulses ranging from 100 ps to ~100 fs, the incorporation of such elements adds to the overall complexity and expense of the ultra short pulse source. It is therefore an object of an embodiment of the present invention to obviate or at least mitigate the foregoing disadvantages of the ultra short pulse sources of radiation known in the art.

It is a further object of an embodiment of the present invention to provide a self-mode locking semiconductor disc laser system.

SUMMARY OF INVENTION

According to a first aspect of the present invention there is provided a self mode locking laser the laser comprising a resonator terminated by first and second mirrors and folded by a third mirror, the third mirror surmounted by a multi-layer semiconductor gain medium including at least one quantum well layer and an optical Kerr lensing layer, wherein a length of the resonator is selected such that a round trip time of a cavity mode corresponds with an upper-state lifetime of one or more semiconductor carriers located within the gain medium.

The above configuration provides a laser which mode locks without requiring a dedicated passive or active mode locking elements to be incorporated therein. By selecting the length of the resonator to be comparable with an upper-state lifetime of one or more semiconductor carriers located within the gain medium causes a small perturbation on the intensity of the output field of the laser which is sufficient for the optical Kerr lensing layer to induce mode locking on the output field. This results in a semiconductor laser that is simpler to operate and maintain and which has reduced production costs compared with those systems known in the art.

The second mirror may be partially reflective and partially transmissive at a fundamental wavelength of the gain medium so as to act as an output coupler for the resonator.

Most preferably the optical Kerr lensing layer comprises a heat spreader mounted upon the semiconductor gain medium. The heat spreader may comprise a layer of diamond crystal.

The resonator may further comprise an aperture stop having an aperture located therein. Preferably the aperture stop is located adjacent to the second mirror. Alternatively the aperture is located adjacent to the first mirror.

The resonator may be additionally folded by a fourth mirror, the fourth mirror being located between the second and third mirrors. The fourth mirror preferably has a concave radius of curvature.

The resonator may be additionally folded by a fifth mirror, the fifth mirror being located between the second and fourth mirrors. The fifth mirror is preferably planar.

The resonator may be additionally folded by a sixth mirror, the sixth mirror being located between the second and fifth mirrors. The sixth mirror preferably has a concave radius of curvature.

Optionally the laser comprises a continuous wave (cw) optical field source the output from which is configured to pump the gain medium. The (cw) optical field source may comprise a fibre coupled laser diode system The resonator may further comprise an astigmatism controller that provides a means for introducing astigmatism to the cavity mode at the gain medium.

In this embodiment the resonator is preferably configured such that the Kerr lensing layer acts to compensate for the astigmatism introduced to the cavity mode. By compensating for the astigmatism introduced to the cavity mode the area of overlap between the cavity mode and a pump spot at the gain medium is increased. As a result the self mode locking nature of the laser is enhanced.

The astigmatism controller may comprise a mirror rotating means. The mirror rotating means may be employed to rotate the fourth mirror so as to vary the angle of incidence of a resonating field upon the fourth mirror.

Most preferably the laser provides an output field comprising ultra short pulses. The ultra short pulses may have a pulse width in the range of 100 ps to 100 fs.

According to a second aspect of the present invention there is provided a method of self mode locking a laser the method comprising providing a resonator terminated by first and second mirrors and folded by a third mirror, the third mirror surmounted by a multilayer semiconductor gain medium including at least one quantum well layer and an optical Kerr lensing layer; and selecting a length of the resonator such that a round trip time of a cavity mode corresponds with an upper-state lifetime of one or more semiconductor carriers located within the gain medium.

The method of self mode locking a laser may further comprise locating an aperture stop having an aperture located within the resonator.

Preferably the aperture stop is located adjacent to the second mirror. Alternatively the aperture is located adjacent to the first mirror.

The method of self mode locking a laser may further comprise folding the cavity by providing a fourth mirror between the second and third mirrors.

The method of self mode locking a laser may further comprise folding the cavity by providing a fifth mirror between the second and fourth mirrors.

The method of self mode locking a laser may further comprise folding the cavity by providing a sixth mirror between the second and fifth mirrors.

The method of self mode locking a laser may further comprise providing a continuous wave (cw) optical field configured to pump the gain medium.

The method of self mode locking a laser may further comprise introducing astigmatism to the cavity mode at the gain medium.

The astigmatism may be introduced to the cavity mode by rotating the fourth mirror so as to increase the angle of incidence of a resonating field upon the fourth mirror.

The method of self mode locking a laser may further comprise configuring the resonator such that the Kerr lensing layer acts to compensate for the astigmatism introduced to the cavity mode. In this way an area of overlap between the cavity mode and a pump spot at the gain medium is increased.

Embodiments of the second aspect of the invention may comprise features to implement the preferred or optional features of the first aspect of the invention or vice versa.

According to a third aspect of the present invention there is provided a self mode locking laser the laser comprising
a resonator terminated by first and second mirrors and folded by a third mirror, the third mirror surmounted by a multilayer semiconductor gain medium including at least one quantum well layer and an optical Kerr lensing layer,
a continuous wave (cw) optical field source the output from which is configured to pump the gain medium,
wherein a length of the resonator is selected such that a round trip time of a cavity mode corresponds with an upper-state lifetime of one or more semiconductor carriers located within the gain medium.

Embodiments of the third aspect of the invention may comprise features to implement the preferred or optional features of the first or second aspects of the invention or vice versa.

According to a fourth aspect of the present invention there is provided a method of self mode locking a laser the method comprising providing a resonator terminated by first and second mirrors and folded by a third mirror, the third mirror surmounted by a multilayer semiconductor gain medium including at least one quantum well layer and an optical Kerr lensing layer;

providing a continuous wave (cw) optical field configured to pump the gain medium; and selecting a length of the resonator such that a round trip time of a cavity mode corresponds with an upper-state lifetime of one or more semiconductor carriers located within the gain medium.

Embodiments of the fourth aspect of the invention may comprise features to implement the preferred or optional features of the first to third aspects of the invention or vice versa.

According to a fifth aspect of the present invention there is provided a self mode locking laser the laser comprising
a resonator terminated by first and second mirrors and folded by a third mirror, the third mirror surmounted by a multilayer semiconductor gain medium including at least one quantum well layer and an optical Kerr lensing layer,
an astigmatism controller that provides a means for introducing astigmatism to a cavity mode at the gain medium,
wherein the resonator is configured such that the Kerr lensing layer acts to compensate for the astigmatism introduced to the cavity mode.

By configuring the resonator such that the Kerr lensing layer acts to compensate for the astigmatism introduced to the cavity mode the area of overlap between the cavity mode and a pump spot at the gain medium is increased. As a result the above configuration provides a laser which mode locks without requiring a dedicated passive or active mode locking elements to be incorporated therein. This results in a semiconductor laser that is simpler to operate and maintain and which has reduced production costs compared with those systems known in the art.

The second mirror may be partially reflective and partially transmissive at a fundamental wavelength of the gain medium so as to act as an output coupler for the resonator.

Most preferably the optical Kerr lensing layer comprises a heat spreader mounted upon the semiconductor gain medium. The heat spreader may comprise a layer of diamond crystal.

The resonator may further comprise an aperture stop having an aperture located therein. Preferably the aperture stop is located adjacent to the second mirror. Alternatively the aperture is located adjacent to the first mirror.

The resonator may be additionally folded by a fourth mirror, the fourth mirror being located between the second and third mirrors. The fourth mirror preferably has a concave radius of curvature.

The resonator may be additionally folded by a fifth mirror, the fifth mirror being located between the second and fourth mirrors. The fifth mirror is preferably planar.

The resonator may be additionally folded by a sixth mirror, the sixth mirror being located between the second and fifth mirrors. The sixth mirror preferably has a concave radius of curvature.

Optionally the laser comprises a continuous wave (cw) optical field source the output from which is configured to pump the gain medium. The (cw) optical field source may comprise a fibre coupled laser diode system The astigmatism controller may comprise a mirror rotating means.

The mirror rotating means may be employed for rotating the fourth mirror so as to vary the angle of incidence of a resonating field upon the fourth mirror.

The length of the resonator may be selected such that a round trip time of a cavity mode corresponds with an upper-state lifetime of one or more semiconductor carriers located within the gain medium.

Most preferably the laser provides an output field comprising ultra short pulses. The ultra short pulses may have a pulse width in the range of 100 ps to 100 fs.

Embodiments of the fifth aspect of the invention may comprise features to implement the preferred or optional features of the first to fourth aspects of the invention or vice versa.

According to a sixth aspect of the present invention there is provided a method of self mode locking a laser the method comprising
  providing a resonator terminated by first and second mirrors and folded by a third mirror, the third mirror surmounted by a multilayer semiconductor gain medium including at least one quantum well layer and an optical Kerr lensing layer;
  introducing astigmatism to the cavity mode at the gain medium; and
  configuring the resonator such that the Kerr lensing layer acts to compensate for the astigmatism introduced to the cavity mode.

The method of self mode locking a laser may further comprise locating an aperture stop having an aperture located within the resonator.

Preferably the aperture stop is located adjacent to the second mirror. Alternatively the aperture is located adjacent to the first mirror.

The method of self mode locking a laser may further comprise folding the cavity by providing a fourth mirror between the second and third mirrors.

The astigmatism may be introduced to the cavity mode by rotating the fourth mirror so as to increase the angle of incidence of a resonating field upon the fourth mirror.

The method of self mode locking a laser may further comprise folding the cavity by providing a fifth mirror between the second and fourth mirrors.

The method of self mode locking a laser may further comprise folding the cavity by providing a sixth mirror between the second and fifth mirrors.

The method of self mode locking a laser may further comprise providing a continuous wave (cw) optical field configured to pump the gain medium.

The method of self mode locking a laser may further comprise selecting a length of the resonator such that a round trip time of a cavity mode corresponds with an upper-state lifetime of one or more semiconductor carriers located within the gain medium.

Embodiments of the sixth aspect of the invention may comprise features to implement the preferred or optional features of the first to fifth aspects of the invention or vice versa.

BRIEF DESCRIPTION OF DRAWINGS

Aspects and advantages of the present invention will become apparent upon reading the following detailed description and upon reference to the following drawings in which.

Figure 1:
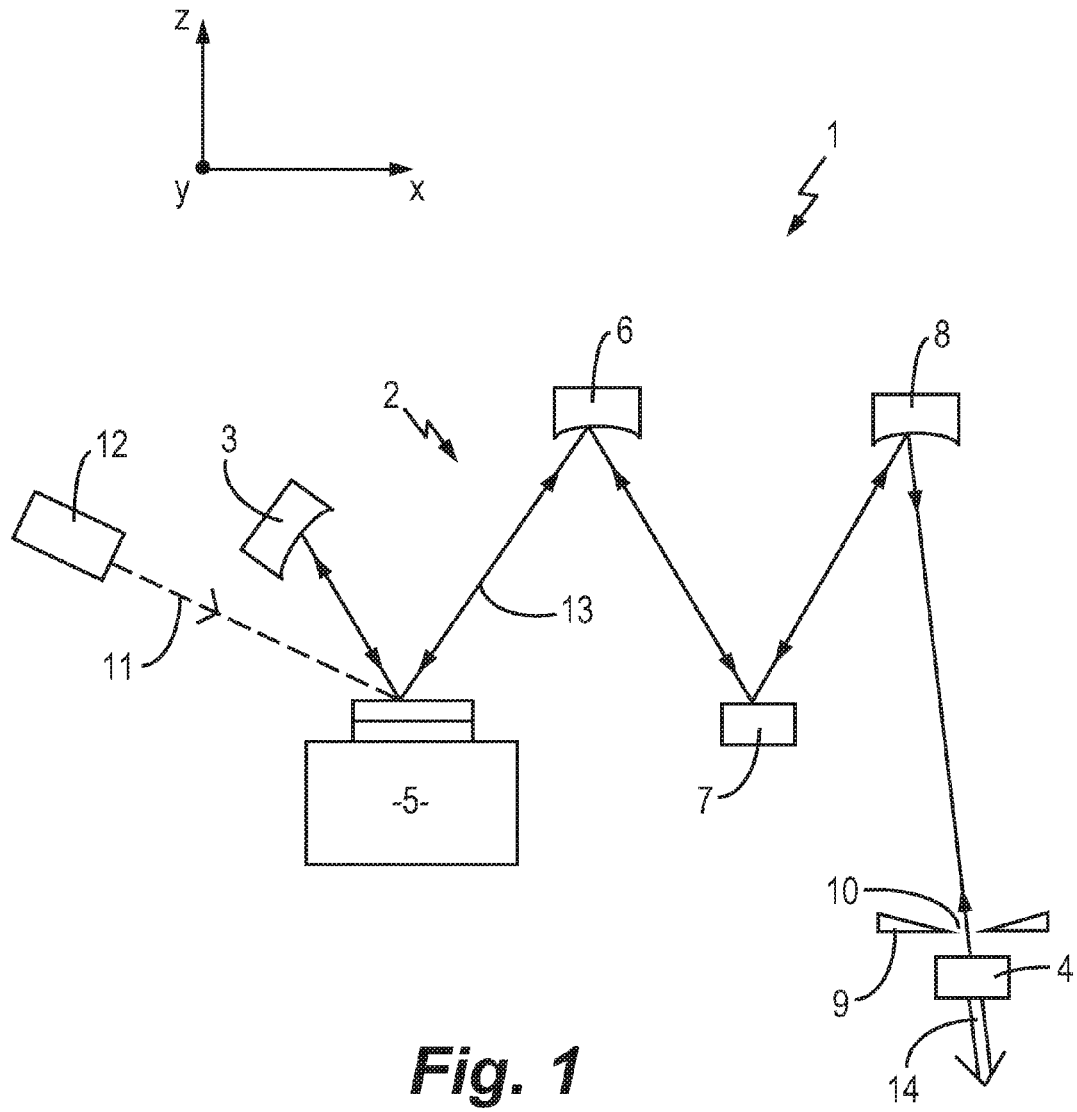
FIG. 1 presents a schematic representation of a self mode-locking, external-cavity surface-emitting, semiconductor laser in accordance with an embodiment of the present invention.

In the description which follows, like parts are marked throughout the specification and drawings with the same reference numerals. The drawings are not necessarily to scale and the proportions of certain parts have been exaggerated to better illustrate details and features of embodiments of the invention.

DETAILED DESCRIPTION

Referring initially to FIG. 1, a schematic representation of a self mode-locking, external-cavity surface-emitting, semiconductor laser 1 in accordance with an embodiment of the present invention is shown. For clarity of understanding axes are provided within this figure. The plane of the cavity referred to below is the plane defined by the x and z axes.

The self mode-locking laser 1 can be seen to comprise a laser-resonator 2 formed between a first 3 and a second mirror 4 and includes a multilayer, optically-pumped, semiconductor disk laser (SDL) 5 further details of which are provided below with reference to FIGS. 2 and 3. As can be seen the SDL 5 is arranged to function as a first folding mirror for the resonator 2. Three further folding mirrors 6, 7 and 8 are included within the resonator 2 and so the resonator 2 can be considered to be a four times folded resonator.

The first mirror 3 and the three folding mirrors 6, 7 and 8 are arranged to be highly reflective at the fundamental wavelength of the SDL 5 while the second mirror 4 is partially reflective and partially transmissive at this fundamental wavelength and so acts as an output coupler for the resonator 2. An aperture stop 9 comprising an aperture 10, such as a slit aperture, may be located adjacent to the second mirror 4. The aperture may be orientated in the plane of the cavity, in a plane perpendicular to the plane of the cavity or indeed comprise an iris and thus have a component in both planes.

The mirrors 3, 6, 7 and 8 may be mounted within piezo-electric controlled mirror mounts so as to provide a means for fine adjusting the alignment of these components. Furthermore, mirrors 3, 6 and 8 are concave mirrors while the mirrors 4 and 7 and the SDL 5 are substantially planar reflecting elements such that the resonator 2 is optically stable and the shape of the cavity mode at the SDL 5 can be controlled, as discussed in further detail below.

A continuous wave (cw) optical pumping field 11 suitable for pumping the SDL 5 is provided by employing a fibre coupled laser diode system 12. In the presently described embodiment the fibre coupled laser diode system 12 is configured to generate a cw optical pumping field 11 at 808 nm. A DILAS® M1F4S22-808 30C-SS2.1 is an example of one such suitable fibre coupled laser diode system 12.

In the presently described embodiment the fibre coupled laser diode system 12 is arranged to pump the gain medium 18 at an angle suitable for providing an elliptical pump spot at the surface of the gain medium 18. It will be appreciated by the skilled reader that the present invention is not so limited and that the fibre coupled laser diode system 12 could provide a pump field 11 that is perpendicular to the gain medium 18 so as to provide a circular pump spot at the surface of the gain medium 18. The fibre coupled laser diode system 12 may also be arranged to pump the gain medium 18 by pumping through the first mirror 3.

In FIG. 1 the intra cavity resonating field is depicted generally by reference numeral 13 while the ultra short pulsed output field from the laser resonator 2 is depicted generally by reference numeral 14.

Figure 2:
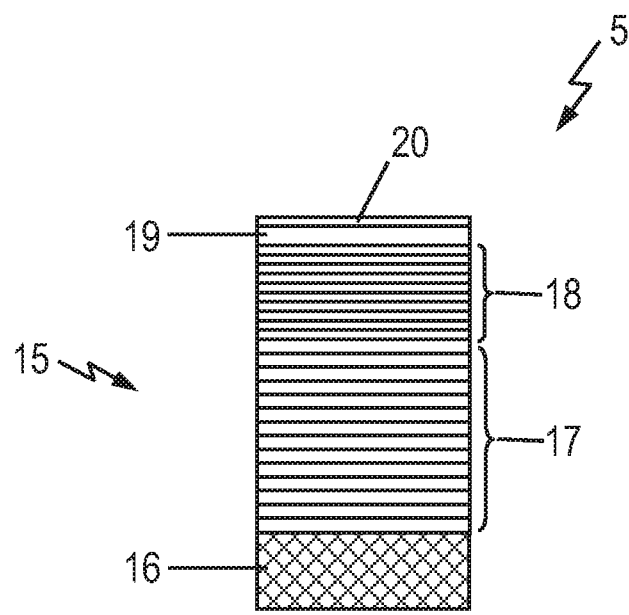
FIG. 2 presents a schematic representation of a semiconductor disk laser (SDL) employed by the laser of FIG. 1.

A schematic representation of the SDL 5 is presented in FIG. 2. The SDL 5 can be seen to comprise a wafer structure 15 that is grown by a metal-organic chemical vapour deposition (MOCVD) technique on a GaAs substrate 16. The deposition of the wafer structure may be achieved by alternative techniques known in the art e.g. molecular beam epitaxy (MBE) deposition techniques. The wafer structure 15 comprises a single distributed Bragg reflector (DBR) region 17, a gain medium 18, a carrier confinement potential barrier 19 and an oxidation prevention layer 20.

There are many variations of the wafer structures 15 incorporated within the SDLs known to those skilled in the art and the present invention is not limited to use with any particular DBR region 17 or gain medium 18 structure. In general, the gain medium 18 will comprise multiple quantum wells equally spaced between half-wave structures that allow the SDL 5 to be optically pumped at a convenient pump wavelength while the DBR regions 17 generally comprise multiple pairs of quarter-wave layers that exhibit high reflectivities.

The presently described embodiments comprise a gain medium 18 comprising InGaAs quantum wells equally spaced between half-wave GaAs structures that allow the SDL 5 to be optically pumped at 808 nm while generating an output at 980 nm. The DBR regions 17 comprise thirty pairs of AlAs—GaAs quarter-wave layers that produce reflectivities greater than 99.9% centred at 980 nm while the carrier confinement potential barrier 19 comprises a single wavelength-thick $Al_{0.3}Ga_{0.7}As$ layer. The oxidation prevention layer 20 may comprise a thin GaAs cap.

Alternative gain mediums known to those skilled in the art that may alternatively be used include alternative gallium arsenide (GaAs) structures capable of generating output wavelengths between 670 nm and 1300 nm; Indium Phosphide (InP) structures capable of generating output wavelengths between 1350 nm and 1600 nm; and Gallium Antimonide (GaSb) structures capable of generating output wavelengths between 1800 nm and 2700 nm. These gain mediums may be based on quantum wells or quantum dots as known to those skilled in the art.

For reasons as will be described in further detail below, the length of the resonator 2 may be selected such that the round trip time of the cavity mode corresponds to the upper-state lifetime of the semiconductor carriers located within the gain medium 18. In the presently described embodiment the lifetime of the semiconductor carries is around 5 ns, giving the resonator a length of around 750 mm and a repetition rate of around 200 MHz.

This arrangement is counter intuitive to the teachings within the art where it is generally desirable to make the length of a resonator as small as possible so as assist in the overall miniaturisation of the system. The main restrictions on the minimum length of a resonator is the requirement to provide sufficient physical space for all of the optical components required to be incorporated into the system and to allow for the desired cavity mode characteristics to be achieved. In systems known in the art the selected resonator lengths result in a round trip time for the cavity mode that is much lower than the upper-state lifetime of the associated gain medium, normally by several orders of magnitude.

Figure 3:
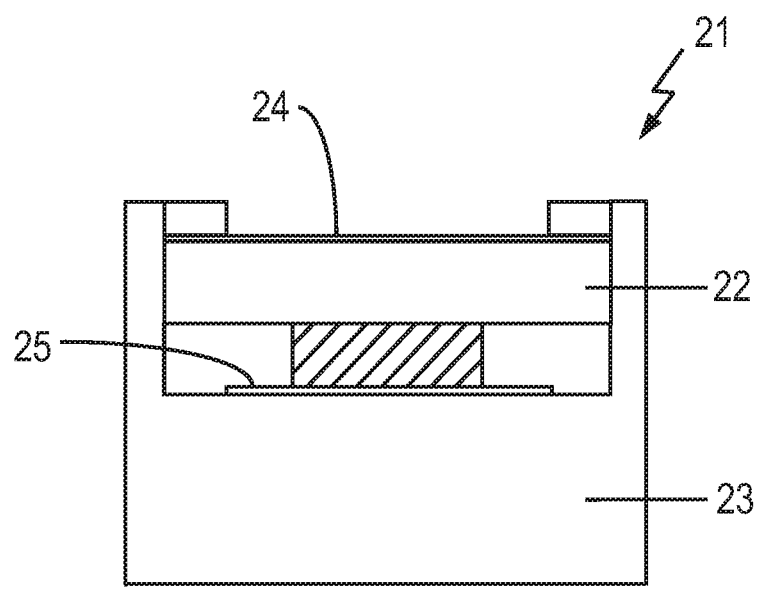
FIG. 3 present a schematic representation of a cooling apparatus employed in conjunction with the SDL of FIG. 2.

FIG. 3 presents further detail of a cooling apparatus 21 employed in order to improve the operating characteristics of the SDL 5. In particular, the cooling apparatus 21 comprises a heat spreader 22 and a standard thermoelectric or water cooler 23. The heat spreader 22 comprises a single diamond crystal that comprises an external, wedged face 24.

A high performance anti-reflection coating may be deposited on the surface of the wedged face 24.

The single diamond crystal heat spreader 22 is bonded by optical contacting with the wafer structure 15 so that the gain medium 18 is located between the heat spreader 22 and the DBR region 17. The wafer structure 15 and heat spreader 22 are then fixed on top of a layer of indium foil 25 onto the thermoelectric or water cooler 23.

Single diamond crystal is well suited to be employed as the heat spreader 22 since it exhibits comparable thermal conductivity levels as sapphire and silicon carbide. Thus, the described arrangement allows the heat spreader 22 to immediately spread the heat generated within the gain medium 18 by the pump field 11 to the cooling apparatus 21 after it has propagated only a limited distance into the gain medium 18. As a result the overall efficiency of the SDL 5 is significantly increased.

In addition there is a further inherent advantage of employing the single diamond crystal as the heat spreader 22. This resides in the fact that the single diamond crystal is a material that exhibits an inherent optical Kerr effect. It is this effect that is exploited in order to configure the semiconductor laser 1 so as to operate as a self mode locking system, as will now be described in further detail with reference to FIG. 4.

Figure 4:
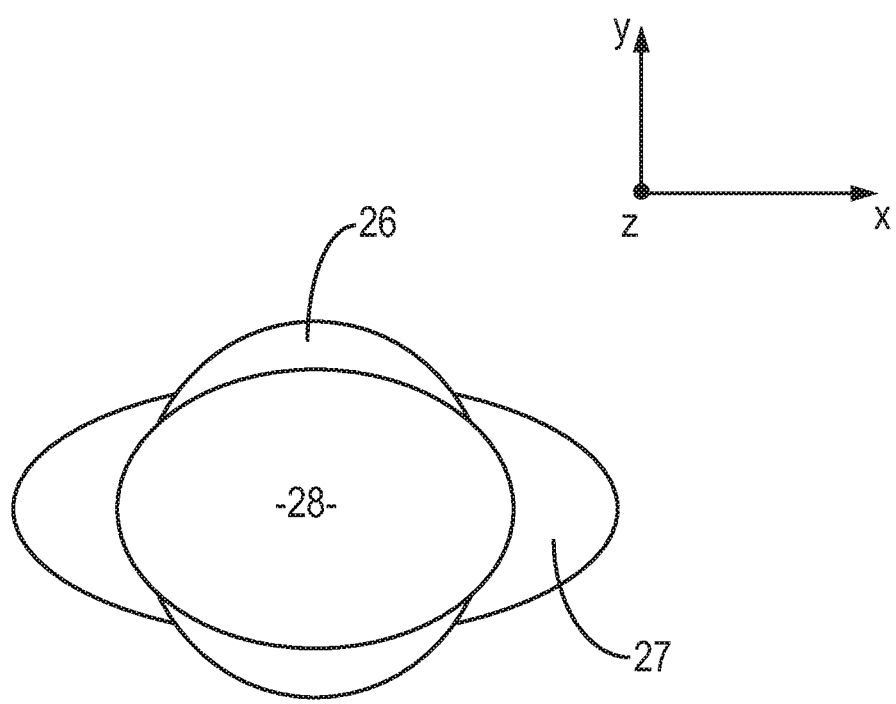
FIG. 4 presents a schematic representation of a cavity mode, a pump spot and a Kerr Lens mode at the surface of the SDL of FIG. 1.

In particular, FIG. 4 presents a schematic representation of a cavity mode 26, a pump spot 27 and a Kerr Lens mode 28 at the surface of the SDL 5 of FIG. 1. The laser is configured such there is an overlap of the area of the cavity mode 26, the pump spot 27 and the Kerr Lens mode 28 at the surface of the SDL 5.

The area of the Kerr lens mode 28 at the SDL 5 is defined by the single diamond crystal heat spreader 22 and in the presently described embodiment it exhibits an elliptical profile with its major axis orientated along the x-axis. In a similar manner the pump spot 27 at the SDL 5 is configured to have an elliptical profile with its major axis also orientated along the x-axis. The major axis of the Kerr lens mode 28 in the presently described embodiment is smaller than the major axis of the pump spot 27.

The concave folding mirror 6 is arranged so as to introduce astigmatism to the cavity mode 26. This is achieved by rotating the concave folding mirror 6 about the y-axis so as to increase the angle of incidence of the resonating field 13 upon this mirror 6. As can be seen from FIG. 4, this rotation results in the cavity mode 26 at the SDL 5 having an elliptical profile with its major axis orientated along the y-axis.

In this configuration the semiconductor laser 1 begins to lase when the gain medium 18 is pumped by the pumping field 11 and the output field 14 is thus generated. Most significant is that the laser is self mode locking such an ultra short output field at 980 nm is produced i.e. pulse widths from 100 ps down to a few femtoseconds can be generated. This result is highly repeatable and the mode locking takes place without any requirement for further input from the operator of the laser 1.

The inventors believe that there exist two independent mechanisms which contribute to allow for self mode locking of the laser 1. In the presently described laser 1 these mechanisms are acting in combination but they may alternatively be independently exploited.

The first mechanism resides in the introduction of the astigmatism to the cavity mode 26 at the surface of the SDL 5. Once the Kerr lensing effect of the heat spreader 22 commences the major axis of the cavity mode 26 is effectively reduced thus causing a greater overlap between the area of the cavity mode 26 and the pump spot 27. Thus, by employing the Kerr lensing effect of the heat spreader 22 to overcome an induced astigmatism a first means for self mode locking of the output field 14 is provided.

This process is further assisted by the second mechanism which results from the fact that length of the resonator 2 is selected such that the round trip time of the cavity mode 26 is close to the upper-state lifetime of the semiconductor carriers located within the gain medium 18. This introduces a small perturbation on the intensity of the output field 14 which is sufficient for the small inherent optical Kerr effect of the single diamond crystal heat spreader 22 to induce mode locking on the output field 14.

As will be appreciated by the skilled reader both of these mechanisms may be assisted by the presence of the aperture stop 9 when the aperture 10 is configured such that the lasing mode of the resonator at the aperture 10 is clipped and lasing is not possible in the absence of the Kerr effect induced by the heat spreader 22. It will be further appreciated that the aperture stop 9 could alternatively be located adjacent to the first mirror 3.

Figure 5:
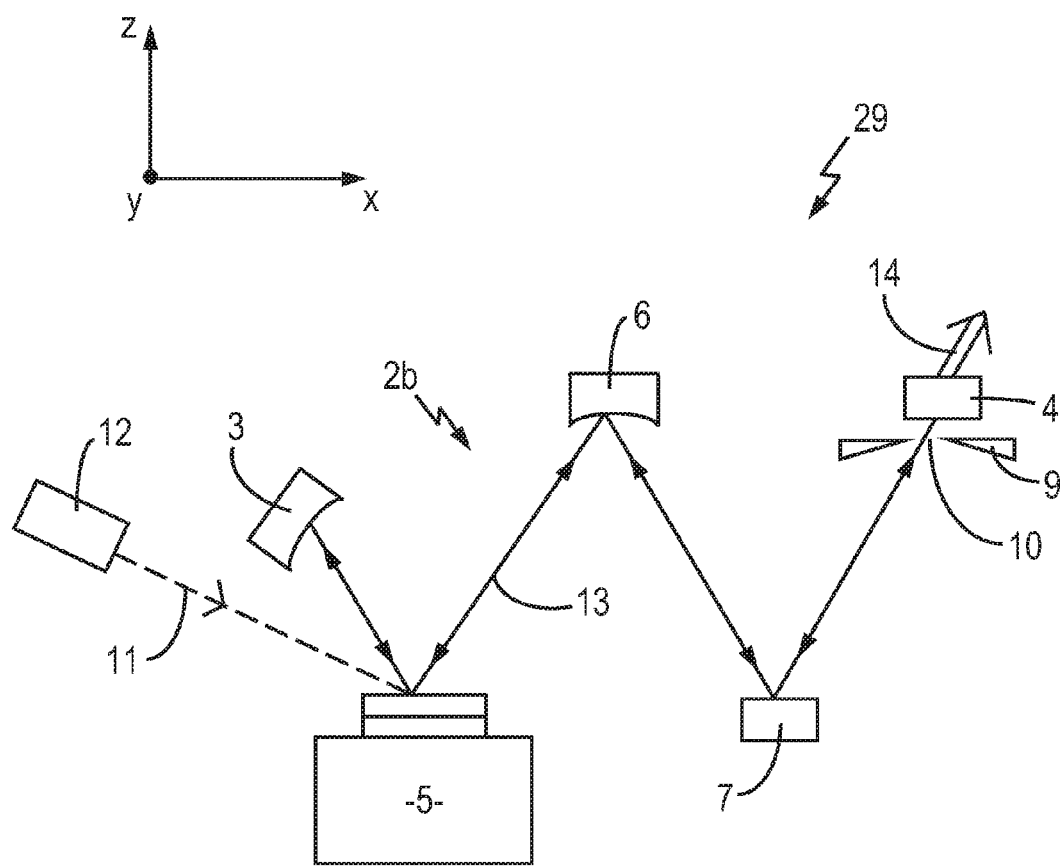
FIG. 5 presents a semiconductor laser in accordance with an alternative embodiment of the present invention.

FIG. 5 presents a schematic representation of a self mode-locking, external-cavity surface-emitting, semiconductor laser 29 in accordance with an alternative embodiment of the present invention, similar to the laser 1 presented in FIG. 1. In this embodiment folding mirrors 8 has been replaced by the output coupler 4 such that the resonator 2b can now be considered to be a three times folded resonator.

Figure 6:
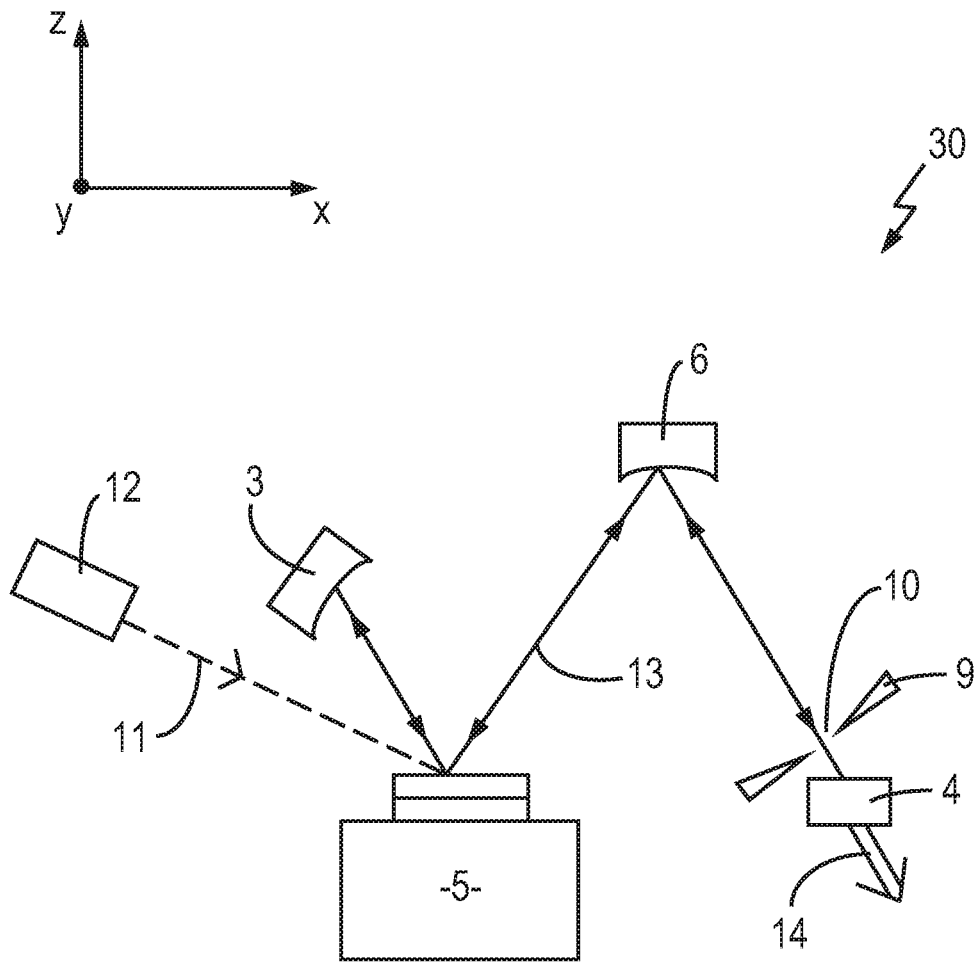
FIG. 6 presents a semiconductor laser in accordance with a further alternative embodiment of the present invention.

FIG. 6 presents a schematic representation of a self mode-locking, external-cavity surface-emitting, semiconductor laser 30 in accordance with a further alternative embodiment of the present invention, similar to the laser 1 presented in FIG. 1. In this embodiment folding mirrors 8 has been omitted and folding mirror 7 has been replaced by the output coupler 4 such that the resonator 2c can now be considered to be a two times folded resonator.

It will be appreciated that a number of alternatives may be incorporated into the above described embodiments. For example the structure of the SDL 5 may be varied so as to provided alternative output wavelengths as required by the particular application for which the semiconductor laser is to be employed.

Furthermore, the orientations of the cavity mode 26, the pump spot 27 and the Kerr Lens mode 28 may be altered such that that the angles between the associated major axes vary from the particular described embodiment. What is important is that the resonator is configured such that an astigmatism introduced to the cavity mode 26 by the configuration of the resonator 2 is reduced by the optical Kerr effect induced by the heat spreader 22 when the gain medium 18 is pumped by the pumping field 11 such that the overlap area between the cavity mode 26 and the pump spot 27 is increased.

The heat spreader may alternatively comprise materials other than single diamond crystal as long as the material employed exhibits the required heat spreading and optical Kerr lensing properties. Sapphire ($Al_2O_2$) and silicon carbide (SiC) are examples of alternative materials that may be employed to produce the heat spreader.

The described semiconductor lasers offer a number of advantages over those known in the art. When compared to the previously described solid state ultrafast lasers the presently described systems are significantly less complex, more compact, have reduced maintenance requirements and are significantly less expensive to produce.

The fact that the described semiconductor lasers are self mode locking also removes the requirement for dedicated passive or active mode locking elements to be incorporated. This again results in the presently described semiconductor lasers having a reduced complexity, maintenance requirement and associated production costs.

The presently described semiconductor laser systems can be employed to generate pulses having pulse widths ranging from 100 ps to ~100 fs, at wavelengths between 670 nm and 2700 nm and with power outputs ranging from 100 mW to 5 W.

The above factors make the described semiconductor lasers ideal for use within nonlinear microscopy techniques e.g. Two-Photon Excited Fluorescence (TPEF) microscopy or other similar multi-photon microscopy techniques. For example the short pulse widths allow for significant depth profiling to be performed on Green Fluorescent Proteins (GFPs) which exhibit excitation peaks at 395 nm and 475 nm or 496 nm depending on the particular GFP employed.

The present invention describes a self mode locking laser and a method for self mode locking a laser. The laser comprises a resonator terminated by first and second mirrors and folded by a third mirror. The third mirror comprises a single distributed Bragg reflector (DBR) upon which is mounted a multilayer semiconductor gain medium and which includes at least one quantum well layer and an optical Kerr lensing layer. Self mode locking may be achieved by configuring the laser resonator such that the lensing effect of the Kerr lensing layer acts to reduce an astigmatism deliberately introduced to the cavity mode. The self mode locking of the laser may be further enhanced by selecting the length of the resonator such that a round trip time of a cavity mode is matched with an upper-state lifetime of one or more semiconductor carriers located within the gain medium.

The foregoing description of the invention has been presented for purposes of illustration and description and is not intended to be exhaustive or to limit the invention to the precise form disclosed. The described embodiments were chosen and described in order to best explain the principles of the invention and its practical application to thereby enable others skilled in the art to best utilise the invention in various embodiments and with various modifications as are suited to the particular use contemplated. Therefore, further modifications or improvements may be incorporated without departing from the scope of the invention as defined by the appended claims.

The invention claimed is:

1. A self mode locking laser the laser comprising
a resonator terminated by first and second mirrors and folded by a third mirror, the third mirror surmounted by a multilayer semiconductor gain medium including at least one quantum well layer and an optical Kerr lensing layer,
an astigmatism controller that provides a means for introducing astigmatism to a cavity mode at the gain medium,
wherein the resonator is configured such that the Kerr lensing layer acts to compensate for the astigmatism introduced to the cavity mode, causing mode locking of an output field of the laser.

2. The self mode locking laser as claimed in claim 1 wherein the second mirror is partially reflective and partially transmissive at a fundamental wavelength of the gain medium so as to act as an output coupler for the resonator.

3. The self mode locking laser as claimed in claim 1 wherein the optical Kerr lensing layer comprises a heat spreader mounted upon the semiconductor gain medium.

4. The self mode locking laser as claimed in claim 3 wherein the heat spreader comprises a layer of diamond crystal.

5. The self mode locking laser as claimed in claim 1 wherein the resonator further comprises an aperture stop having an aperture located therein.

6. The self mode locking laser as claimed in claim 5 wherein the aperture stop is located adjacent to the second mirror.

7. The self mode locking laser as claimed in claim 5 wherein the aperture is located adjacent to the first mirror.

8. The self mode locking laser as claimed in claim 1 wherein the resonator is additionally folded by a fourth mirror, the fourth mirror being located between the second and third mirrors.

9. The self mode locking laser as claimed in claim 8 wherein the fourth mirror has a concave radius of curvature.

10. The self mode locking laser as claimed in claim 8 wherein the resonator is additionally folded by a fifth mirror, the fifth mirror being located between the second and fourth mirrors.

11. The self mode locking laser as claimed in claim 10 wherein the fifth mirror is planar.

12. The self mode locking laser as claimed in claim 10 wherein the resonator is additionally folded by a sixth mirror, the sixth mirror being located between the second and fifth mirrors.

13. The self mode locking laser as claimed in claim 12 wherein the sixth mirror has a concave radius of curvature.

14. The self mode locking laser as claimed in claim 1 wherein the laser further comprises a continuous wave (cw) optical field source the output from which is configured to pump the gain medium.

15. The self mode locking laser as claimed in claim 14 wherein the (cw) optical field source comprises a fibre coupled laser diode system.

16. The self mode locking laser as claimed in claim 1 wherein the astigmatism controller comprises a mirror rotating means.

17. The self mode locking laser as claimed in claim 16 wherein the mirror rotating means is employed for rotating a fourth mirror, the fourth mirror being located between the second and third mirrors, the mirror rotating means rotating the fourth mirror so as to vary an angle of incidence of a resonating field upon the fourth mirror.

18. The self mode locking laser as claimed in claim 1 wherein a length of the resonator is selected such that a round trip time of a cavity mode corresponds with an upper-state lifetime of one or more semiconductor carriers located within the gain medium.

19. The self mode locking laser as claimed in claim 1 wherein the laser provides an output field comprising ultra short pulses having a pulse width in the range of 100 ps to 100 fs.

20. A method of self mode locking a laser the method comprising
providing a resonator terminated by first and second mirrors and folded by a third mirror, the third mirror surmounted by a multilayer semiconductor gain medium including at least one quantum well layer and an optical Kerr lensing layer;
introducing astigmatism to the cavity mode at the gain medium; and
configuring the resonator such that the Kerr lensing layer acts to compensate for the astigmatism introduced to the cavity mode, causing mode locking of an output field of the laser.

21. The method of self mode locking a laser as claimed in claim 20 wherein the method further comprises locating an aperture stop having an aperture located therein within the resonator.

22. The method of self mode locking a laser as claimed in claim 21 wherein the aperture stop is located adjacent to the second mirror.

23. The method of self mode locking a laser as claimed in claim 21 wherein the aperture is located adjacent to the first mirror.

24. The method of self mode locking a laser as claimed in claim 20 wherein the method further comprises folding the resonator by providing a fourth mirror between the second and third mirrors.

25. The method of self mode locking a laser as claimed in claim 24 wherein the astigmatism is introduced to the cavity mode by rotating the fourth mirror so as to increase the angle of incidence of a resonating field upon the fourth mirror.

26. The method of self mode locking a laser as claimed in claim 24 wherein the method further comprises folding the resonator by providing a fifth mirror between the second and fourth mirrors.

27. The method of self mode locking a laser as claimed in claim 26 wherein the method further comprises folding the resonator by providing a sixth mirror between the second and fifth mirrors.

28. The method of self mode locking a laser as claimed in claim 20 wherein the method further comprises providing a continuous wave (cw) optical field configured to pump the gain medium.

29. The method of self mode locking a laser as claimed in claim 20 wherein the method further comprises selecting a length of the resonator such that a round trip time of a cavity mode corresponds with an upper-state lifetime of one or more semiconductor carriers located within the gain medium.

\* \* \* \* \*